US010539883B2

(12) United States Patent
Deguenther et al.

(10) Patent No.: US 10,539,883 B2
(45) Date of Patent: Jan. 21, 2020

(54) ILLUMINATION SYSTEM OF A MICROLITHOGRAPHIC PROJECTION DEVICE AND METHOD FOR OPERATING SUCH A SYSTEM

(71) Applicant: Carl Zeiss SMT GmbH, Oberkochen (DE)

(72) Inventors: Markus Deguenther, Aalen (DE); Vladimir Davydenko, Bad Herranalb (DE); Dirk Juergens, Lauchheim (DE); Thomas Korb, Schwaebisch Gmuend (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 15/997,498

(22) Filed: Jun. 4, 2018

(65) Prior Publication Data
US 2018/0284622 A1 Oct. 4, 2018

Related U.S. Application Data

(63) Continuation of application No. PCT/EP2016/078695, filed on Nov. 24, 2016.

(30) Foreign Application Priority Data

Dec. 8, 2015 (DE) ........................ 10 2015 224 522

(51) Int. Cl.
G03F 7/20 (2006.01)
(52) U.S. Cl.
CPC ...... *G03F 7/70633* (2013.01); *G03F 7/70075* (2013.01); *G03F 7/70116* (2013.01); *G03F 7/70208* (2013.01)

(58) Field of Classification Search
CPC ............ G03F 7/70075; G03F 7/70116; G03F 7/70208; G03F 7/70633
See application file for complete search history.

(56) References Cited

U.S. PATENT DOCUMENTS 5,048,968 A * 9/1991 Suzuki ................. G03F 9/7065
257/E21.211
5,229,872 A * 7/1993 Mumola ............. G03F 7/70291
349/2

(Continued)

FOREIGN PATENT DOCUMENTS

WO WO 2015/074746 A1 5/2015

OTHER PUBLICATIONS

Translation of International Search Report for corresponding Appl No. PCT/EP206/078695, dated Mar. 10, 2017.

*Primary Examiner* — Deoram Persaud
(74) *Attorney, Agent, or Firm* — Fish & Richardson P.C.

(57) ABSTRACT

The disclosure provides an illumination system of a microlithographic projection device having an image plane, in which a mask can be arranged, and a first object plane, which is optically conjugate to the image plane. A first illumination optical unit illuminates the first object plane with first projection light so that the first projection light has a first illumination angle distribution in the image plane. A second illumination optical unit illuminates a second object plane, which is optically conjugate to the image plane, with second projection light so that the second projection light has a second illumination angle distribution differing from the first illumination angle distribution in the image plane. An optical integrator is arranged exclusively in the light path of the first projection light.

20 Claims, 7 Drawing Sheets

(56) References Cited

U.S. PATENT DOCUMENTS

| | | | | |
|---|---|---|---|---|
| 5,309,523 A * | 5/1994 | Iwaki | G06K 9/748 | |
| | | | 382/210 | |
| 6,383,940 B1 * | 5/2002 | Yoshimura | G03F 7/70075 | |
| | | | 355/52 | |
| 6,778,257 B2 * | 8/2004 | Bleeker | G03F 7/70283 | |
| | | | 353/30 | |
| 7,116,403 B2 * | 10/2006 | Troost | G03F 7/70225 | |
| | | | 355/67 | |
| 7,884,921 B2 * | 2/2011 | Noboru | G02B 27/108 | |
| | | | 355/46 | |
| 7,924,406 B2 * | 4/2011 | Loopstra | G03F 7/70208 | |
| | | | 355/67 | |
| 8,736,813 B2 * | 5/2014 | Smith | G03B 27/54 | |
| | | | 355/67 | |
| 8,792,081 B2 * | 7/2014 | Owa | G03F 7/70116 | |
| | | | 355/67 | |
| 9,110,380 B2 * | 8/2015 | Werschnik | G02B 26/0841 | |
| 9,500,954 B2 * | 11/2016 | Deguenther | G02B 26/0833 | |
| 9,671,699 B2 * | 6/2017 | Patra | G02B 27/0905 | |
| 9,678,438 B2 * | 6/2017 | Patra | G03F 7/70091 | |
| 9,804,499 B2 * | 10/2017 | Deguenther | G03F 7/70191 | |
| 2006/0017902 A1 * | 1/2006 | Rhyzhikov | G03F 7/70225 | |
| | | | 355/67 | |
| 2007/0242249 A1 | 10/2007 | Shibazaki et al. | | |
| 2007/0242363 A1 | 10/2007 | Noboru et al. | | |
| 2007/0279595 A1 * | 12/2007 | Magarill | G03B 21/20 | |
| | | | 353/33 | |
| 2008/0055903 A1 * | 3/2008 | Akiyama | F21V 7/0025 | |
| | | | 362/245 | |
| 2009/0040490 A1 * | 2/2009 | Shigematsu | G03F 7/70091 | |
| | | | 355/66 | |
| 2009/0135390 A1 | 5/2009 | La Fontaine et al. | | |
| 2009/0135396 A1 * | 5/2009 | Mizuno | G03F 7/70108 | |
| | | | 355/71 | |
| 2013/0063729 A1 * | 3/2013 | Iwai | G01N 21/41 | |
| | | | 356/486 | |
| 2013/0114060 A1 | 5/2013 | Patra et al. | | |
| 2015/0301455 A1 | 10/2015 | Schlesener et al. | | |

* cited by examiner

ILLUMINATION SYSTEM OF A MICROLITHOGRAPHIC PROJECTION DEVICE AND METHOD FOR OPERATING SUCH A SYSTEM

CROSS-REFERENCE TO RELATED APPLICATIONS

The present application is a continuation of, and claims benefit under 35 USC 120 to, international application PCT/EP2016/078695, filed Nov. 24, 2016, which claims benefit under 35 USC 119 of German Application No. 10 2015 224 522.5, filed Dec. 8, 2015. The entire disclosure of these applications are incorporated by reference herein.

FIELD

The disclosure relates to an illumination system of a microlithographic projection apparatus. Such apparatuses are used to image a mask with a pattern made of the fine structures onto a light-sensitive surface. Typically, the surface is a photoresist in the case of a projection exposure apparatus and an electronic photodetector in the case of a mask inspection apparatus.

BACKGROUND

Integrated electrical circuits and other microstructured components are usually produced by virtue of a plurality of structured layers being applied onto a suitable substrate, which can be a silicon wafer, for example. For the purposes of structuring the layers, these are initially covered by a photoresist (resist), which is sensitive to light from a specific wavelength range, e.g. light in the deep ultraviolet (DUV), vacuum ultraviolet (VUV) or extreme ultraviolet (EUV) spectral range. Subsequently, the wafer thus coated is exposed in a projection exposure apparatus. Here, a mask with a pattern of structures is illuminated by an illumination system and imaged on the photoresist with the aid of a projection lens. Since the absolute value of the imaging scale generally is less than 1 in this case, such projection lenses are sometimes also referred to as reduction lenses.

The wafer is subjected to an etching process after developing the photoresist, as a result of which the layer is structured in accordance with the pattern on the mask. The photoresist which still remains is then removed from the remaining parts of the layer. This process is repeated until all layers are applied to the wafer.

In order to be able to image the pattern on the mask on to the photoresist in an ideal manner, the mask is illuminated, in general, with an illumination angle distribution that is specifically adapted to the pattern. The term illumination angle distribution is understood to mean the distribution of the directions of the light rays when they are incident on the mask.

A spatial distribution in a pupil plane of the illumination system, which has a Fourier relationship with the mask plane, corresponds to the illumination angle distribution in the mask plane. Therefore, the corresponding spatial distribution in the pupil plane is often resorted to for the purposes of describing the illumination angle distribution in the mask plane. In the case of an annular illumination setting, a ring-shaped region is illuminated in the pupil plane, for example. For the illumination angle distribution, this means that the projection light is only incident obliquely on the individual field points. Here, the occurring angles are set by the inner and outer radii of the ring that illuminates the pupil.

In the case of a multi-pole illumination, there only is illumination of individual poles that are separated from one another in the pupil plane of the illumination system. In this case, the projection light assigned to a pole is incident on the mask at comparatively large angles, but these only differ a little from one another.

A difficulty in the lithographic production of microstructured components involves exactly aligning the structures of adjacent layers with respect to one another. Similar issues arise if the structures within a single layer are produced by multiple exposure. Then, the structures that were defined by a first exposure step have to be aligned very exactly with respect to the structures that were defined by a second exposure step.

The overlay is a measure for how exactly the structures produced by different masks can be arranged in relation to one another within a component. The tolerable overlay has been greatly reduced in recent years, particularly in the case of methods for multiple exposure, the use of which has become frequent in the meantime.

Overlay markers are frequently arranged on the masks in order to be able to better align the structures produced on the wafer in a plurality of exposure steps. The overlay markers can be situated outside of, or within, the structures to be imaged and usually consist of arrangements of comparatively coarse lines, the width of which typically lies in the order of 1 µm in the case of wavelengths in the DUV and VUV spectral range. Usually, the overlay markers of one exposure step are imaged exactly over the overlay markers defined in a preceding exposure step with a different mask. A measurement of the relative orientations of the overlay markers occurring after the exposure allows determination as to whether the overlay is so small that the wafer can be processed further or whether the admissible tolerances have been exceeded, which can occasionally be corrected by subsequent adjustments in the subsequent processing steps.

However, issues may arise when imaging the overlay markers onto the light-sensitive layer because the lines of which the overlay marker consists usually have a significantly greater pitch and are therefore spaced apart further from one another than the lines of the actual mask structure. For reasons of simplicity, the lines of the overlay markers are referred to as "coarser lines" on account of the greater pitch and the lines of the actual mask structure are referred to as "finer lines", even though the width of the lines is not directly important in this context.

As already mentioned above, the mask structures can only be ideally imaged if they are illuminated by light that has an illumination angle distribution that is adapted to the mask structures. This likewise applies to the coarser lines of the overlay markers; they are often imaged in optimal fashion if they are illuminated using a conventional illumination setting in which the light is incident on the mask from all sides at small angles. Then, a central circular disk is illuminated in the pupil. By contrast very narrow parallel lines, as often occur in the mask structures, often involve a dipole setting in which the light is only incident on the mask from two opposing sides at relatively large angles of incidence.

If the coarser lines of the overlay markers are illuminated by a dipole setting, this leads to a very small depth of field when imaging the overlay markers. The reason for this lies in the fact that the occurring diffraction angles are small on account of the greater pitch. As a result, the projection light that is incident obliquely in the case of a dipole setting is hardly deflected. This is why each illumination pole produces an extremely non-telecentric image; i.e., the beams that are incident on the light-sensitive layer do not extend in an axis-parallel fashion but are strongly inclined. The depth of field is correspondingly low as very small axial displacements of the light-sensitive layer lead to a significant lateral offset of the image in that case. The consequence of this is clear rounding of the edges in the images of the overlay markers. As a result, it can become difficult to determine the location of the lines with the desired accuracy.

A further issue when imaging overlay markers consists of imaging aberrations of the projection lens having different effects on the imaging of the coarser lines of the overlay markers on the one hand and the finer lines of the actual mask structure on the other hand.

Consequently, it would be ideal if the overlay markers could be illuminated using a different illumination setting to the remaining mask structures. However, the projection light has the same illumination angle distribution at all locations in the illumination field in conventional illumination systems. However, illumination systems in which the illumination angle distribution can be set within certain limits in a field-dependent manner, i.e., depending on the location of the illumination field, have already been proposed.

Thus, US 2013/0114060 A1 has disclosed an illumination system in which an optical integrator produces a multiplicity of secondary light sources which together illuminate a field plane in which an adjustable field stop is arranged. This field plane is imaged onto the mask by a field stop lens. Here, images of the entrance facets of the optical integrator overlay in the field plane and consequently also on the mask. As a result, a very uniform illumination of the mask is obtained. In order to be able to set the illumination angle distribution in a field-dependent manner, very many small optical modulators are situated in a field plane upstream of the optical integrator, the distribution of the projection light on the entrance facets of the optical integrator being able to be changed without losses due to the small optical modulators. Since each entrance facet illuminates the mask from another direction, this renders it possible to set the illumination angle distribution on the mask in a field-dependent manner.

An even more flexible approach is facilitated by the illumination system known from WO 2015/074746 A1. In order to be able to better influence the light distribution on the entrance facets of the optical integrator, micromirrors of a digital micromirror device (DMD) are imaged onto the entrance facets in that case. As a result of this, it is possible to set practically any field dependence of the illumination angle distribution—albeit at the expense of low light losses.

What both approaches have in common is that the entrance facets of the optical integrator have to be illuminated in a highly resolved and variable manner. Since the entrance facets are very small, it is very challenging from a technological point of view to produce variable intensity distributions with the desired precision in that case.

SUMMARY

The present disclosure seeks to provide an illumination system of a microlithographic projection apparatus and a method for operating such an illumination system, by which it is possible to better image overlay markers or other comparatively coarse structures via a comparatively simple approach.

The present disclosure provides an illumination system of a microlithographic projection apparatus having an image plane, in which a mask is arrangeable, a first object plane, which is optically conjugated to the image plane, and having a first illumination optical unit, which is configured to illuminate the first object plane with first projection light in such a way that the first projection light has a first illumination angle distribution in the image plane. The illumination system moreover has a second object plane, which likewise is optically conjugated to the image plane. A second illumination optical unit is configured to illuminate the second object plane with second projection light in such a way that the second projection light has a second illumination angle distribution in the image plane, the second illumination angle distribution differing from the first illumination angle distribution. Further, the illumination system has an optical integrator, which is arranged in the light path of the first projection light only.

The disclosure is based on the discovery that, for an illumination of the overlay markers that is optimized in terms of angles, it is sufficient to illuminate a second object plane with second projection light and a desired illumination angle distribution which, although it is imaged on the image plane, it is imaged without involvement of the optical integrator. Accordingly, it is not necessary either to vary the intensity distribution on a very large number of entrance facets of the optical integrator, as used in the prior art.

Naturally, it is possible, in principle, to provide in addition to the second object plane still a third object plane or further object planes, which are likewise imaged onto the image plane and illuminated in such a way that the projection light incident on the further object planes has different illumination angle distributions on the mask. However, in order to optimally image the overlay markers, it is sufficient, as a rule, if exactly one second object plane is present, from which the second projection light is emitted in such a way that, in the image plane in which the mask is situated, it has the illumination angle distribution that is ideal for imaging the overlay markers.

If the entrance facets of the optical integrator are illuminated uniformly by the first projection light in a conventional manner, the entire illumination field on the mask that is illuminable by the illumination system is illuminated by the first projection light. Then, not only the second projection light but also the first projection light is incident at the locations at which the overlay markers are situated. However, as a result of the second projection light that is optimized in terms of angles to the overlay markers, the imaging of the latter is improved in such a way that the images of the overlay markers are no longer significantly offset in relation to the images of the remaining mask structures. Then, the orientation of the images of the mask structures can be deduced from measuring the images of the overlay markers.

The optical integrator, which is only arranged in the light path of the first projection light, usually has the property that an intensity distribution of the first projection light on the optical integrator sets the first illumination angle distribution. Usually, the optical integrator has an optical raster element, for example a fly's eye lens element. The optical integrator is preferably arranged in a light path of the first projection light between a pupil forming device, which may have a diffractive optical element or a micromirror array, and the first object plane. However, the optical integrator may also have a reflective embodiment, as is desired for illumination systems that are designed for light wavelengths in the extreme ultraviolet (EUV) spectral range. Then, the optical integrator includes one or two facet mirrors with a multiplicity of mirror facets.

According to the disclosure, the second illumination angle distribution of the second projection light, which is provided for imaging the overlay markers, differs from the first illumination angle distribution of the first projection light, which is provided for imaging the remaining mask structures. In principle, the two illumination angle distributions can partly overlap.

However, the illumination angle distributions of the first and the second projection light preferably do not overlap on the mask. Illumination angles of the first illumination distribution then do not occur in the second illumination angle distribution and, conversely, illumination angles of the second illumination angle distribution do not occur in the first illumination angle distribution. Such completely different illumination angle distributions are expedient, in particular, if the overlay markers should be illuminated with a conventional setting with small angles of incidence while the remaining mask structures should be illuminated with an annular or multi-pole illumination setting. In such cases, all illumination angles of the first illumination angle distribution are greater than a limit angle in terms of absolute value and all illumination angles of the second illumination angle distribution are smaller than the limit angle in terms of absolute value.

As a rule, the overlay markers only cover a very small part of the entire mask. Since the second projection light should only illuminate the overlay markers, it is therefore sufficient if the first projection light renders an illumination field in the image plane illuminable and the second projection light illuminates only one or more portions of the illumination field, but not the entire illumination field, at a given time. Then, the second illumination optical unit can preferably be set in such a way that the portion covers an overlay marker situated on the mask.

In the case of scanner-type projection apparatuses, the mask and the light-sensitive surface move synchronously during the illumination. As a result, the overlay markers migrate along the scanning direction together with the mask through the illumination field, which is illuminated by the first and the second projection light. However, in the process, the second projection light should only illuminate the portions moving with the mask, in which the overlay markers are situated.

Therefore, in an exemplary embodiment, the second illumination optical unit is configured to produce an intensity distribution on the second object plane, which moves synchronously with the mask along the displacement direction parallel to the second object plane. This moving intensity distribution is imaged onto the image plane, in which the mask is situated, and moves synchronously with the latter. Consequently, the portion covering an overlay marker can migrate synchronously with the overlay marker such that the latter is illuminated in an optimal fashion in terms of angle, while the first projection light with the first illumination angle distribution is (also) incident on the remaining mask structures. These mask structures can be illuminated conventionally in a field-independent manner using the first projection light. Then, the first illumination optical unit is configured to produce a stationary intensity distribution on the first object plane during a scanning process.

In order to produce the moving intensity distribution on the second object plane, tiltable mirrors can illuminate the second object plane with light spots. As a result of tilting the mirrors, the light spots move synchronously with the mask, as desired.

An even more accurate and sharply delimited intensity distribution can be produced in the second object plane if a modulator surface of a spatial light modulator (SLM) is arranged there, a modulation pattern that changes synchronously with the movement of the mask being producible on the modulator surface. By way of example, such a spatial light modulator can be embodied as a digital micromirror array (DMD) or as an LCD panel.

The modulator surface can then be illuminated uniformly or only in portions and the modulation pattern arises by virtue of individual pixels of the spatial light modulator being brought into an "off" position.

In order to keep the light losses as low as possible, the two approaches specified above can be combined with one another. Then, a further spatial light modulator is configured to produce a coarse intensity distribution on the modulation surface, the intensity distribution changing synchronously with the movement of the mask along the displacement direction. Then, the spatial light modulator forming the modulator surface produces a highly resolved intensity pattern moving along the displacement direction from the coarse intensity distribution, the image of the highly resolved intensity pattern in the mask plane exactly covering the overlay markers on the mask.

Here, the further spatial light modulator can also have the function of splitting projection light produced by a light source into the first and the second projection light. In an exemplary embodiment, the further spatial light modulator directs some of the incident projection light onto the optical integrator in a spatially resolved manner as first projection light in order to set the first illumination angle distribution. At the same time, it directs some of the incident projection light onto the second object plane as the second projection light in order to produce an intensity distribution in the object plane, which moves synchronously with the mask and which is imaged onto the overlay markers. As a result, the illumination of the overlay markers that differs in terms of angles can be realized by a particularly simple simple.

The second illumination angle distribution of the second projection light, which illuminates the overlay markers, can be set in a conventional manner. By way of example, a diffusing plate, a diffractive optical element, a fly's eye lens element or any other refractive optical raster element can be arranged in the beam path of the second projection light. In particular, scattering structures can be provided directly on the modulator surface of the spatial light modulator in order to impress the desired second illumination angle distribution onto the second projection light. Should the second illumination angle distribution be variable, the optical elements listed in an exemplary manner above can be received in interchange holders such that they can be changed quickly and without tools for elements that produce a different angle distribution. Naturally, the use of a spatial light modulator also comes into question.

An intensity distribution on the second object plane that moves synchronously with the mask can also be realized without a spatial light modulator. Thus, for example, a surface of a carrier, which carries a pattern of reflective or scattering structures and which is displaceable along the displacement direction, can be arranged in the second object plane. If this surface is illuminated by the second projection light, only those regions which carry reflective or scattering structures can direct the second projection light onto the image plane. Then, the images of these regions migrate synchronously with the mask during the displacement of the carrier.

In order to merge the first projection light with the second projection light, provision can be made of an input coupling element that is arranged between the first and the second object plane on the one hand and the image plane on the other hand. By way of example, this input coupling element can be a lens, a prism or a mirror. Preferably, the input coupling element is arranged in, or in the vicinity of, a pupil plane of the illumination system in such a way that the first projection light passes through the pupil plane outside of the input coupling element. This is possible if the first and the second illumination angle distribution do not overlap because the first and the second projection light then pass through the pupil plane at different locations.

It is particularly expedient if the input coupling element is arranged in the light path of the first projection light between an adjustable field stop and the image plane. Then, the first projection light already has the desired illumination angle distribution and therefore only passes through a region of the pupil plane in the case of non-conventional illumination settings.

If the illumination system includes a lens that has a plurality of optical elements and images the field stop onto the image plane, at least one of these optical elements can lie in the light path of the first projection light only. Expressed differently, the second projection light is coupled into the beam path of the first projection light within the lens and preferably in the pupil plane thereof to be precise.

If an individual illumination of the overlay markers or other coarser structures is not desired, the input coupling element can be removed or replaced by an optically neutral element so as not to impede the propagation of the first projection light. By way of example, if a plane mirror is introduced into the pupil plane, the plane mirror coupling the second projection light into the beam path of the lens, then the mirror can be replaced by a transparent plane plate made out of glass where desired.

The present disclosure also provides a method for operating an illumination system of a microlithographic projection apparatus includes the following steps:
a) arranging a mask in an image plane of the illumination system;
b) illuminating a first object plane, which is optically conjugated to the image plane, with first projection light in such a way that the first projection light has a first illumination angle distribution in the image plane;
c) illuminating a second object plane, which differs from the first object plane and which is likewise optically conjugated to the image plane, with second projection light in such a way that the second projection light has a second illumination angle distribution in the image plane, the second illumination angle distribution differing from the first illumination angle distribution;
d) overlaying an image of the first object plane and an image of the second object plane in the image plane,
wherein the first projection light in step b) is incident on an optical integrator that is arranged in the light path of the first projection light only.

The remarks made at the outset in relation to the advantages and advantageous exemplary embodiments apply here accordingly.

In particular, the first projection light can illuminate an illumination field in the image plane and the second projection light can illuminate only one or more portions of the illumination field, but not the entire illumination field, at a given time. Here, for example, the portion can cover an overlay marker or other coarser structures, which is situated on the mask.

The mask is displaced along a scanning direction in an exemplary embodiment. An intensity distribution, which is produced by the second projection light in the second object plane, is displaced along a displacement direction parallel to the second object plane in a manner synchronous to the movement of the mask. An intensity distribution, which is produced by the first projection light in the first object plane, can remain stationary in this case.

A modulator surface of a spatial light modulator can be arranged in the second object plane, wherein a modulation pattern that is modified synchronously with the movement of the mask is produced on the modulator surface.

A further spatial light modulator can produce the second intensity distribution on the modulation surface in such a way that the intensity distribution changes synchronously with the movement of the mask along the displacement direction.

The further spatial light modulator can divide projection light into the first and the second projection light. In particular, the further spatial light modulator can direct the first projection light onto the optical integrator.

In an exemplary embodiment, a surface of a carrier, which carries a pattern of reflective or scattering structures and which is displaced along the displacement direction, is arranged in the second object plane.

The first projection light and the second projection light can be merged by an input coupling element that is arranged between the first and the second object plane on the one hand and the image plane on the other hand. The input coupling element can be arranged in, or in the vicinity of, a pupil plane of the illumination system, wherein the first projection light passes through the pupil plane outside of the input coupling element. In particular, the input coupling element can have a mirror or a prism.

The first projection light and the second projection light can be merged between an adjustable field stop and an image plane. If a lens having a plurality of optical elements images the field stop onto the image plane, at least one optical element can be arranged in the light path of the first projection light only.

BRIEF DESCRIPTION OF THE DRAWINGS

Further features and advantages of the disclosure will become apparent from the following description of exemplary embodiments with reference to the drawings, in which.

DESCRIPTION OF PREFERRED EXEMPLARY EMBODIMENTS

1. Basic Design of the Projection Exposure Apparatus

Figure 1:
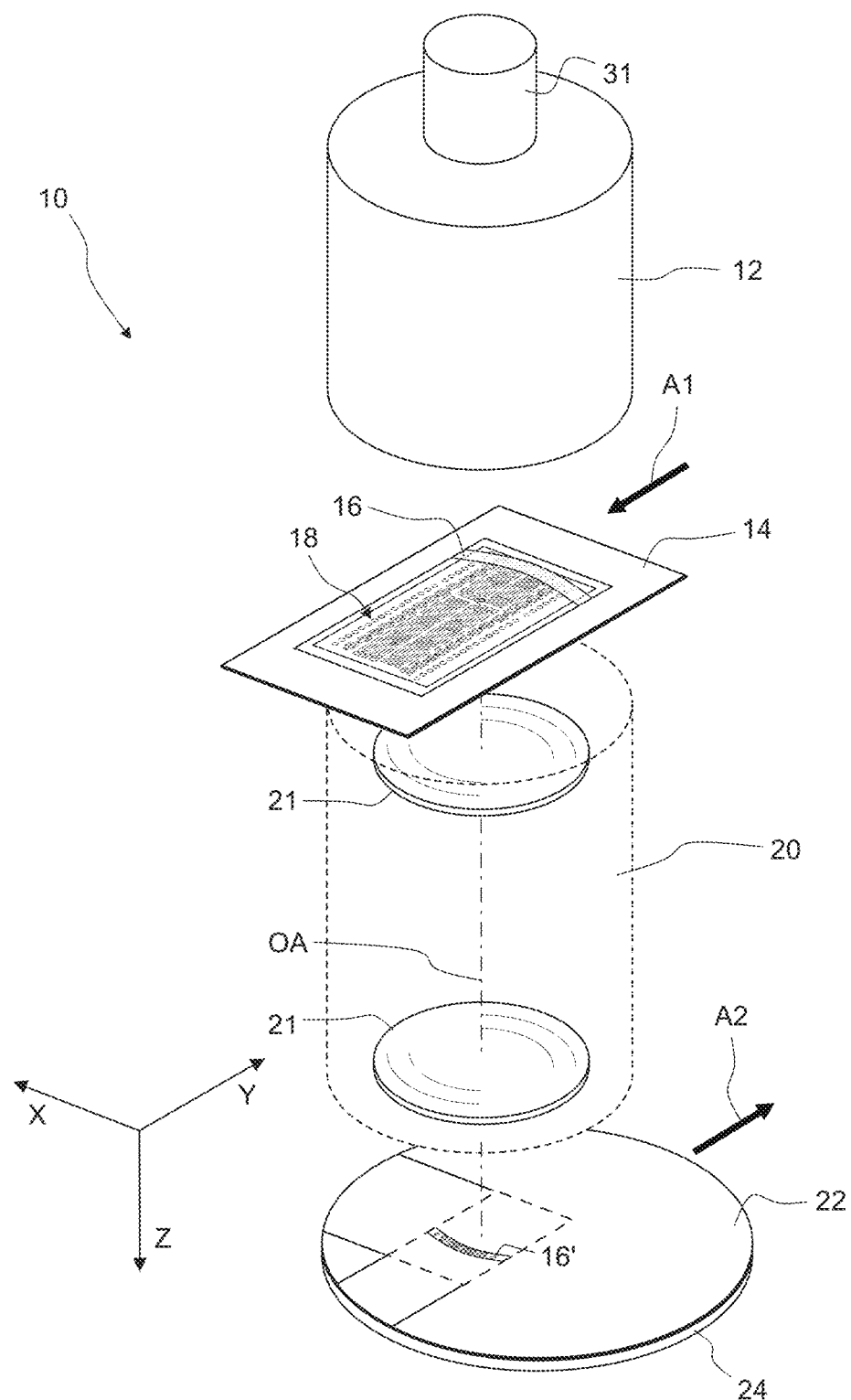
FIG. 1 shows a much simplified perspective illustration of a microlithographic projection exposure apparatus.

FIG. 1 shows a projection exposure apparatus 10 in a very schematic perspective illustration, the projection exposure apparatus being suitable for the lithographic production of microstructured components. The projection exposure apparatus 10 contains an illumination system 12 that illuminates a narrow illumination field 16, having a ring-segment-type shape in the illustrated exemplary embodiment, on a mask 14. Naturally, other illumination field shapes, e.g., rectangles, also come into question.

Structures 18 on the mask 14 lying within the illumination field 16 are imaged on a light-sensitive layer 22 with the aid of a projection lens 20, which contains a plurality of lens elements 21 and, optionally, further optical elements. The light-sensitive layer 22, which may be e.g. a photoresist, is applied to a wafer 24 or another suitable substrate and is situated in the image plane of the projection lens 20. Since the projection lens 20 generally has an imaging scale $|\beta|<1$, the structures 18 lying within the illumination field 16 are imaged with reduced size on a projection field 16'.

In the depicted projection exposure apparatus 10, the mask 14 and the wafer 24 are displaced along a scanning direction denoted by Y during the projection. The ratio of the displacement speeds in this case equals the imaging scale $\beta$ of the projection lens 20. If the projection lens 20 inverts the image (i.e. $\beta<0$), the displacement movements of the mask 14 and of the wafer 24 extend counter to one another, as indicated in FIG. 1 by arrows A1 and A2. In this manner, the illumination field 16 passes over the moving mask 14 in a scanner-type fashion such that even relatively large structured regions can be projected contiguously on the light-sensitive layer 22.

2. Illumination System

Figure 2:
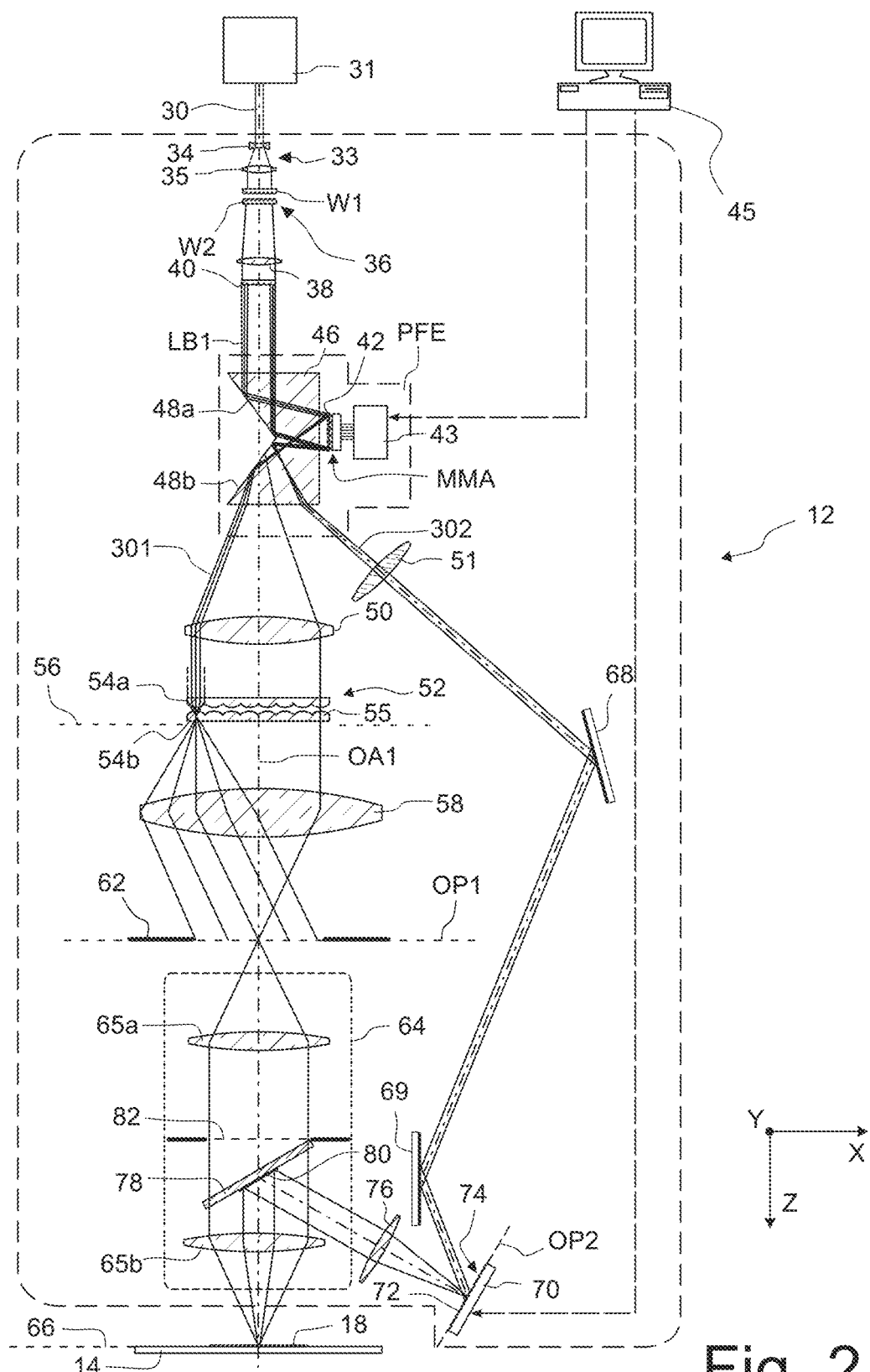
FIG. 2 shows a schematic meridional section through an illumination system according to the disclosure.

FIG. 2 shows an illumination system 12 in a meridional section. Linearly polarized projection light 30 from a light source 31 is supplied to the illumination system 12, the light source being arranged outside of a housing 32 and consequently not being a constituent part of the illumination system 12. The projection light 30 produced by the light source has a wavelength of $\lambda=193$ nm in the illustrated exemplary embodiment; other wavelengths such as 248 nm or 157 nm are likewise possible.

The projection light 30 can be guided via deflection mirrors in pipes (not illustrated) between the light source 31 and the illumination system 12, the pipes forming a beam delivery device.

A beam expander 33 is arranged in the illumination system 12, the beam expander expanding the projection light 30 and including two lens elements 34, 35 in the illustrated exemplary embodiment. In the beam path downstream thereof is a beam homogenizer 36, including a first honeycomb plate W1 and a second honeycomb plate W2 and mixing the projection light 30.

Figure 3:
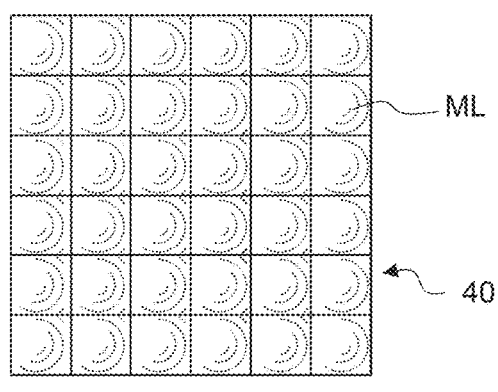
FIG. 3 shows a plan view of a microlens array shown in FIG. 2.

The beam homogenizer 36 is followed by a first condenser 38. A microlens array 40 is arranged in the light path downstream of the condenser 38, the construction of the microlens array 40 being shown in a plan view in FIG. 3. The microlens array 40 includes a multiplicity of spherical microlenses ML with square circumferential areas such that the microlens array 40 divides the incident projection light 30 into a multiplicity of individual converging beams, one of which is denoted by LB1 in FIG. 2.

Figure 4:
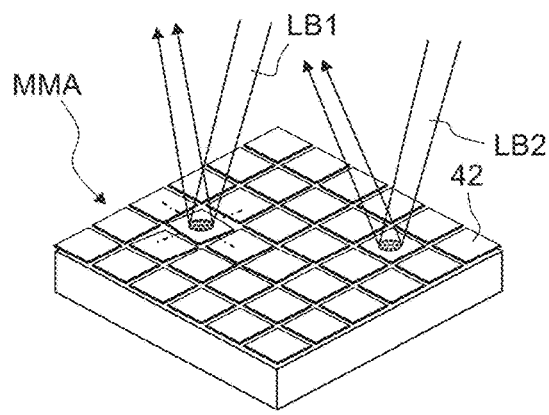
FIG. 4 shows a perspective simplified view of a micromirror array shown in FIG. 2.

Arranged downstream of the microlens array 39 in the light path is a pupil forming device PFE, which includes a micromirror array MMA with a plurality of micromirrors 42. In a simplified perspective illustration, FIG. 4 shows a plan view of the micromirror array MMA. Depending on the position of the micromirrors 42, incident light beams LB1, LB2 are deflected in different directions. Consequently, the micromirrors 42 constitute light deflection elements, the deflection angles of which are variable in an individual and continuous manner. To this end, the micromirror array MMA is connected to a control device 43, which in turn communicates with an overarching central controller 45 of the projection exposure apparatus 10.

The pupil forming device PFE further includes a prism 26 with two inclined faces 48a, 48b, at which the projection light 30 entering into the prism is reflected by total-internal reflection. The prism 46 directs the projection light 30 onto the micromirror array MMA and direct light reflected thereby back into the beam path.

The micromirror array MMA divides the projection light 30 into first projection light 301 and second projection light 302. To this end, the micromirror array MMA includes a first group of micromirrors 42, which direct the incident projection light 30 in the direction of a second condenser 50. Another second group of micromirrors 42, much smaller in number, directs the light onto a third condenser 51. Here, the micromirrors 42 of the second group can have a different neutral position in terms of angle than the micromirrors 42 of the first group since the deflection angles produced by the two groups differ significantly from one another.

Initially, the light path of the first projection light 301 is explained in more detail below with reference to FIG. 2.

a) First Projection Light

The second condenser 50, on which the first projection light 301 is incident, causes the distribution of deflection angles produced by the micromirror array MMA to be converted into a spatial distribution on the entrance face of an optical integrator 52. In a manner similar to the beam homogenizer 34, the optical integrator 52 includes two plates 54a, 54b with fly's eye lens elements 55, wherein each pair of fly's eye lens elements 55 facing one another defines an optical channel that produces a secondary light source. The secondary light sources are situated in a pupil plane 56 of the illumination system 12, the pupil plane coinciding with a front focal plane of a fourth condenser 58. An intermediate field plane, in which an adjustable field stop 62 is arranged and which is referred to as first object plane OP1 below, is situated in a back focal plane of the fourth condenser 58. The first object plane OP1 is imaged with the aid of a field stop lens 64 including lens elements 65a, 65b onto an image plane in which the mask 14 is arranged and which is therefore referred to as mask plane 66 below.

As shown by the beam path shown in FIG. 2, the local intensity distribution in the pupil plane 56 sets the illumination angle distribution of the first projection light 301 in the first object plane OP1 and in the mask plane 66 optically conjugated thereto. Since each light spot on the entrance face of the optical integrator 52 leads to a corresponding intensity distribution in the pupil plane 56, it is possible to vary the illumination angle distribution of the first projection light 301 in the mask plane 66 by modifying the deflection angles produced by the micromirrors 42.

By contrast, the angle distribution of the secondary light sources produced in the pupil plane 56 sets the intensity distribution of the first projection light in the first object plane OP1 and hence also the maximum dimensions of the illumination field 16 along the X- and Y-direction. In the XZ-plane (i.e., the plane of the sheet of FIG. 2), the secondary light sources therefore have a large numerical aperture, while the secondary light sources in the YZ-plane parallel to the scanning direction have a significantly smaller numerical aperture. The slot form of the illumination field 16 in the mask plane 66 arises in this way.

b) Second Projection Light

After passing through the third condenser 51, the second projection light 302 is directed onto a spatial light modulator 70, which is embodied as a DMD (digital micromirror device), via two plane deflection mirrors 68, 69. The spatial light modulator 70 includes a very large number of microscopically small micromirrors 72, which are tiltable about a tilt axis and which can assume only two different tilt positions. The surfaces of the micromirrors 72 form a modulator surface 74, which is arranged in a second object plane OP2. The object plane OP2 is imaged onto the mask plane 66 via a lens element 76 and the lens element 65*b* of the field stop lens 64.

In order to merge the first projection light 301 and the second projection light 302, a transparent glass plate 78, the central region of which carries a reflective coating 80, is situated in the field stop lens 64. The glass plate forms a mirror that is situated in the vicinity of a pupil plane 82 of the field stop lens 64 in the light path of the first projection light 301 and therefore arranged between the adjustable field stop 62 and the mask plane 66.

3. Function of the Illumination System

The function of the illumination system 12 is explained in more detail below with reference to FIGS. 5 to 8.

a) Different Illumination Settings

Figure 5:
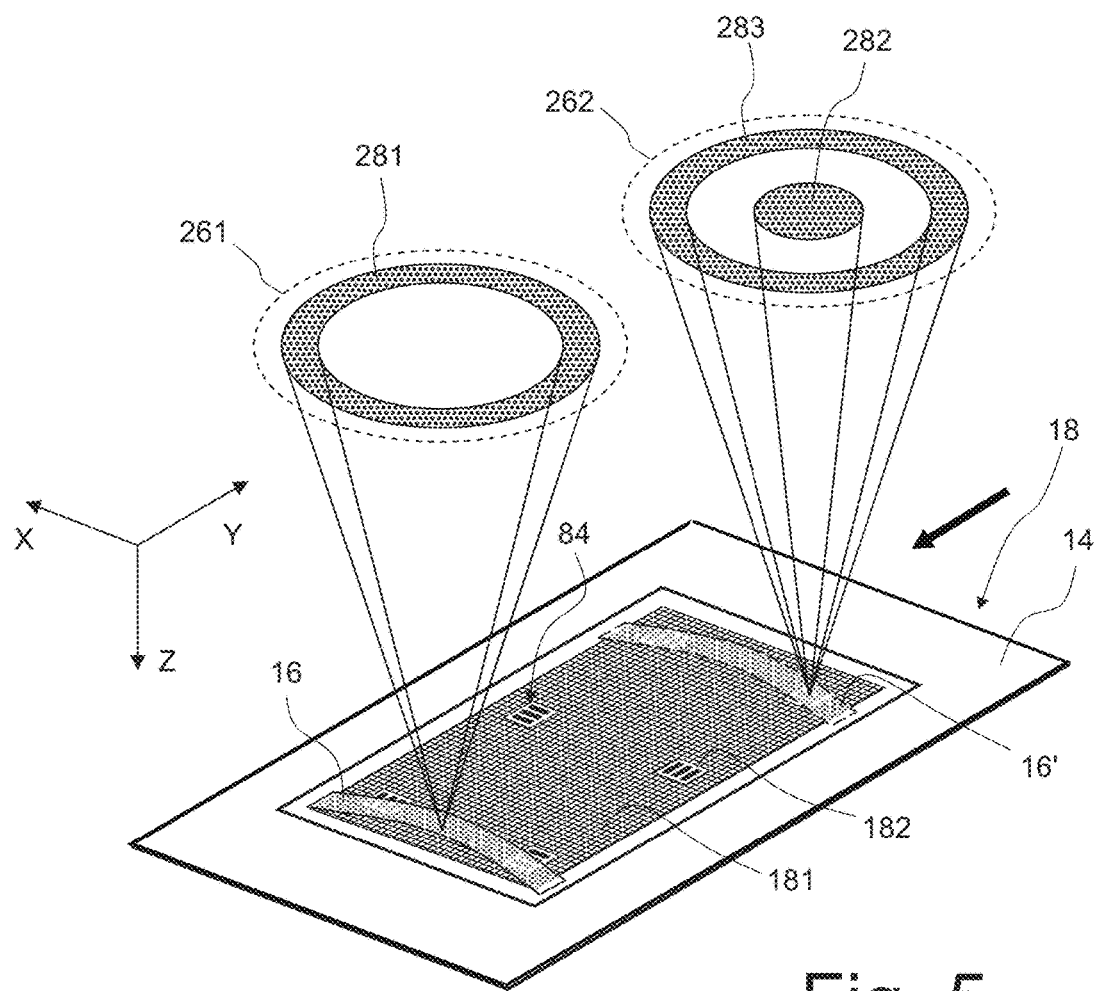
FIG. 5 shows a perspective illustration of the mask and two light beams, which are directed on mask structures and an overlay marker, respectively.

FIG. 5 shows a schematic perspective illustration of the mask 14. It is clear that two different structure types can be distinguished on the mask 14. In a first structure type, the structures consist of very fine and closely spaced apart lines, which can extend along the scanning direction Y or along the direction X perpendicular thereto. For reasons of simplicity, these structures of the first structure type are illustrated as a fine-mashed grid in FIG. 5 and denoted as mask structures 181 below.

A second structure type includes broader structures spaced further apart from one another, the structures being distributed in groups over the surface of the mask 14. These groups form overlay markers 84, which is why the structures of the second structure type are referred to as overlay structures 182 below. Naturally, the overlay markers 84 can also be arranged at different locations, to be precise outside of the mask structures 181 in particular, and can have both overlay structures extending along the scanning direction Y and overlay structures arranged perpendicular thereto.

FIG. 5 schematically illustrates a first pupil 261 for a beam that converges in a point of the illumination field 16 on which mask structures 181 are situated. It is suggested that the very fine mask structures 181 that extend in orthogonal directions are imaged best onto the light-sensitive layer 22 in the case of an illumination with an annular illumination setting. This is why a ring-shaped region 281 is illuminated in the first pupil 261.

Next to the first pupil 261, a second pupil 262 is shown for a beam that converges at a subsequent time in a point of the illumination field 16 on which overlay structures 182 are situated. Since these are relatively coarse, they are imaged best onto the light-sensitive layer 22 when illuminated by a conventional illumination setting. Therefore, a circular-disk-shaped region 282, through which projection light likewise passes, is situated in the second pupil 262 in addition to the ring-shaped region 281.

Since the mask 14 moves under the illumination field 16 along the scanning direction Y during the scanning process, the overlay markers 84 also migrate through the stationary illumination field 16 along the scanning direction Y. In between, there are time intervals during which no overlay markers 64 are situated in the illumination field 16. The illumination system 12 is therefore controlled in such a way that beams with the second pupil 262 are guided, at least intermittently, along the scanning direction Y through the illumination field 16 and follow the overlay markers 64 in the process.

How this control is implemented is explained below on the basis of FIGS. 6 to 8.

b) Control

Figure 6:
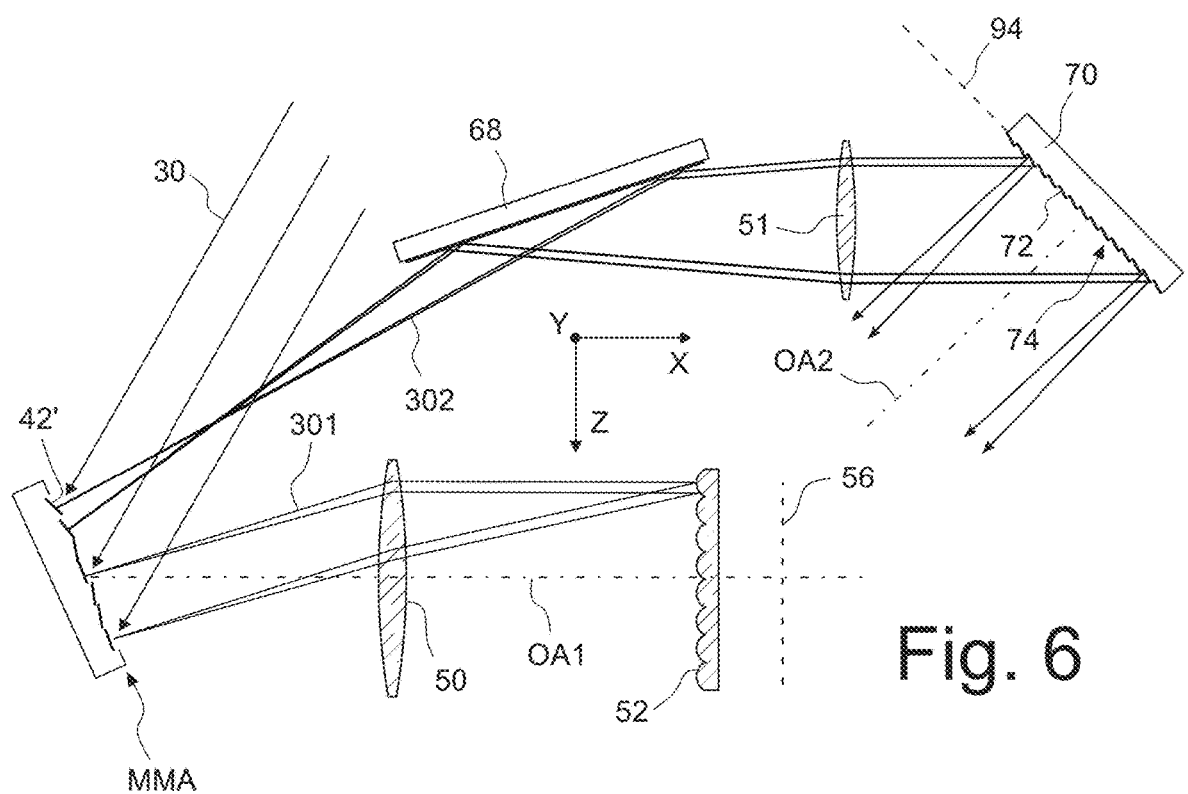
FIG. 6 shows a schematic illustration of important optical components of the illumination system shown in FIG. 2.

FIG. 6 schematically shows functionally important components of the exemplary embodiment shown in FIG. 2. In the illumination system 12, the micromirror array MMA, together with the prism 46, constitutes the pupil forming device PFE, by which the illumination of the pupil plane 56 by the first projection light 301 is set. The second condenser 50 establishes a Fourier relationship between the plane of the micromirror array MMA on the one hand and the optical integrator 52 on the other hand, and so angles of the first projection light 301 set with the aid of the micromirrors 42 are translated into locations on the optical integrator 52. This can be identified in FIG. 6 by virtue of two beams that emanate from the micromirror array MMA at the same angle superimposing at the same location on the optical integrator 52.

However, at the same time, the micromirror array MMA also constitutes a beam splitter that divides the incident projection light 30 into the first projection light 301 and the second projection light 302. Two micromirrors of the micromirror array MMA, denoted by 42', are oriented in such a way that they direct the incident projection light 30 not onto the second condenser 50 but onto the third condenser 51 via the deflection mirror 68.

As can moreover be identified in FIG. 6, the location at which the second projection light 302 is incident on the spatial light modulator 70 can be influenced by adjusting these two micromirrors 42'. In this case, the third condenser 51 also establishes a Fourier relationship between the plane in which the micromirrors 42 of the micromirror array MMA are arranged and the second object plane OP2 in which the micromirrors 72 of the spatial light modulator 70 are arranged. Just like the second condenser 50, the third condenser 51 can be dispensed with without replacement; in this case, the second projection light 302 would be incident on the spatial light modulator 70 in a non-collimated manner.

In conjunction with FIG. 2, it is clear from FIG. 6 that the micromirrors 72 of the spatial light modulator 70 are arranged in such a sawtooth-like manner in their "on" position that the second projection light 302 is directed completely in the direction of the lens 76 and the glass plate 78, and hence onto the mask 14. The optical axis OA2, which is set by the lens elements 76 and 65*b*, extends perpendicular to the modulation surface 74 as a consequence of the sawtooth-like arrangement of the micromirrors 72. As a result, the intensity distribution on the modulation surface 74 is imaged without distortion onto the mask plane 66.

The two micromirrors 42' of the micromirror array MMA that are illustrated at the top in FIG. 6 are oriented in such a way that the light beams reflected thereby illuminate light spots on the spatial light modulator 70 that are situated opposite edges of the modulator surface 74. As a consequence of the imaging by the lens elements 76, 65*b*, these light beams therefore also illuminate two regions on the edges, lying opposite one another in the X-direction, of the illumination field 16.

In the illustrated exemplary embodiment, the illumination angle distribution of the second projection light 302 is set by roughening of the surfaces of the micromirrors 72 of the spatial light modulator 70. It is clear from FIG. 6 that the collimated beams incident on the micromirrors 72 depart from the latter with a slight divergence as a consequence of the scattering on the roughened surface. Therefore, only a relatively small central region is illuminated by the second projection light 302 in the pupil plane of the lens, formed by the lens elements 76 and 65b, that corresponds to the pupil plane 82 of the field stop lens 64.

Figure 7:
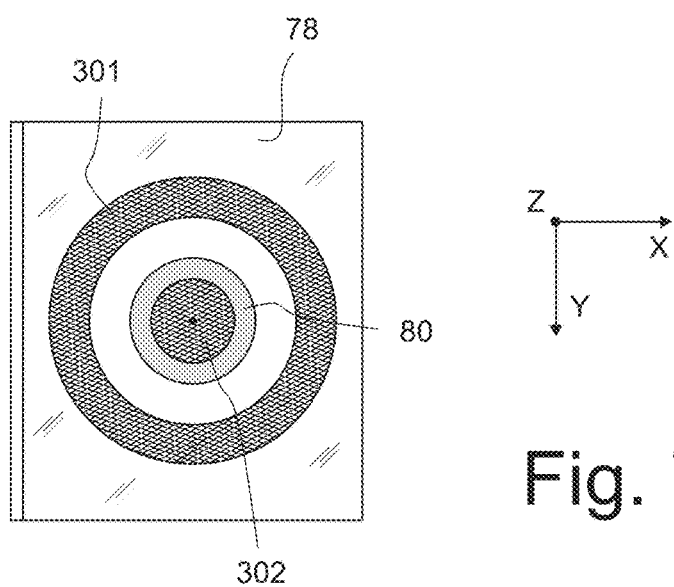
FIG. 7 shows a plan view of an input coupling element along the optical axis of the illumination system.

This can be seen best in FIG. 7, which shows a plan view of the glass plate 78 parallel to the Z-direction, i.e., along the optical axis OP1. Since the glass plate in the field stop lens 64 is arranged obliquely to the optical axis OP2 along which the second projection light 302 propagates, the reflective coating 80 covers an elliptical region on the glass plate 78. However, the region with the reflective coating 80 is circular, as can be seen in FIG. 7, in the case of a projection along the optical axis OA1, along which the first projection light 301 propagates. Since the light beams emanating from the micromirrors 72 of the spatial light modulator 70 are only weakly divergent and the glass plate 78 is situated in a pupil plane, the region is illuminated by the second projection light 302 on the reflective coating 80 has a relatively small diameter.

On the glass plate 78, the first projection light 301 passes through a ring-shaped region since the optical integrator 52 was also illuminated in a ring-shaped manner with the aid of the micromirror array MMA. The internal diameter of the ring-shaped region is so large that the reflective coating 80 does not impede the propagation of the first projection light 301. The near-pupil arrangement of the glass plate 78 with the reflective coating 80 consequently renders it possible to arrange a mirror formed by the reflective region 80 in the beam path of the first projection light 301, without impeding the propagation of the latter.

It is further clear from FIG. 7 that the regions that are illuminated by the first projection light 301 and by the second projection light 302 on the glass plate 78 with the near-pupil arrangement correspond to the regions 282, 283 in the second pupil 262, which is shown in FIG. 5 for the beam illustrated on the right. If the central region 282 of the second pupil 262 should be larger, this can be achieved by a rougher reflective surface on the micromirror 74 of the spatial light modulator 70. As an alternative thereto, it is possible, for example, to introduce a diffusing plate into the beam path of the second projection light 302, the diffusing plate increasing the angular light spectrum of the second projection light 302, as a result of which the external diameter of the central region 282 in the second pupil 262 becomes larger.

Conversely, the size and the dimensions of the ring 281 are set by the pupil forming device PFE. For instance, if the internal diameter of the ring 281 should be reduced, the micromirrors 42 of the micromirror array MMA should be actuated in such a way that the width of the region illuminated on the optical integrator 52 increases inwardly.

In principle, it is also possible to replace the spatial light modulator 70 by a fixed mirror. Since the micromirrors 42 of the micromirror array MMA are continuously tiltable about two tilt axes, the light spots assigned to the micromirrors 42' can be guided continuously over the second object plane OP2, and hence over the mask plane 66, during the scanning process in order to be able to follow the moving overlay markers 84.

The function of the spatial light modulator 70 is explained below on the basis of FIGS. 8A to 8D.

c) Spatial Light Modulator

Figure 8A:
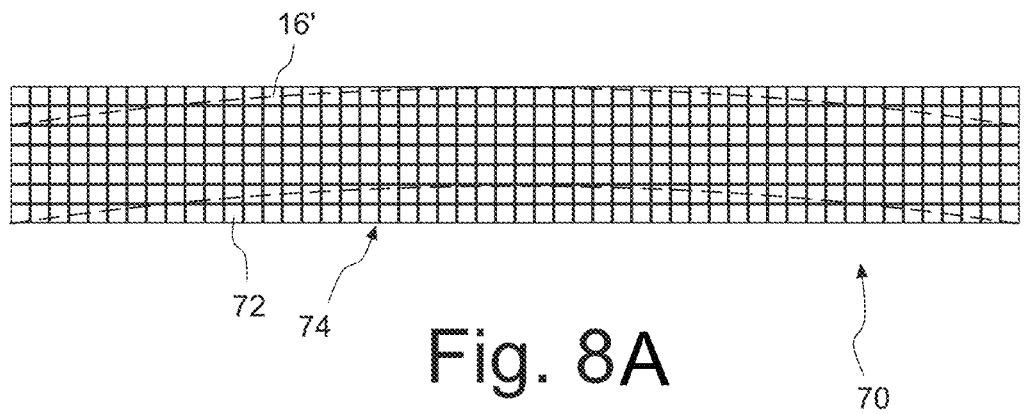
FIGS. 8A to 8D show plan views of a spatial light modulator, illuminated by the second projection light, at different times during a scanning process.

FIG. 8A shows a plan view of the modulator surface 74 of the spatial light modulator 70 with the micromirrors 72. It is suggested that the micromirrors 72 depicted in white color are in an "off" position and consequently do not direct incident second projection light 302 in the direction of the lens element 76 and the glass plate 78. A region that is imaged by the lens elements 76, 65b onto the illumination field 16 in the mask plane 66 is indicated by 16'.

Since all micromirrors 72 are in the "off" position in FIG. 8A, even if the second projection light 302 were directed onto the spatial light modulator 70 by the mirrors 42' micromirror array MMA, the projection light could reach the mask 14. Consequently, the illumination field 16 is only illuminated by the first projection light 301 at this instant, the first projection light having the illumination angle distribution illustrated on the left in FIG. 5 by the first pupil 261.

Figure 8B:
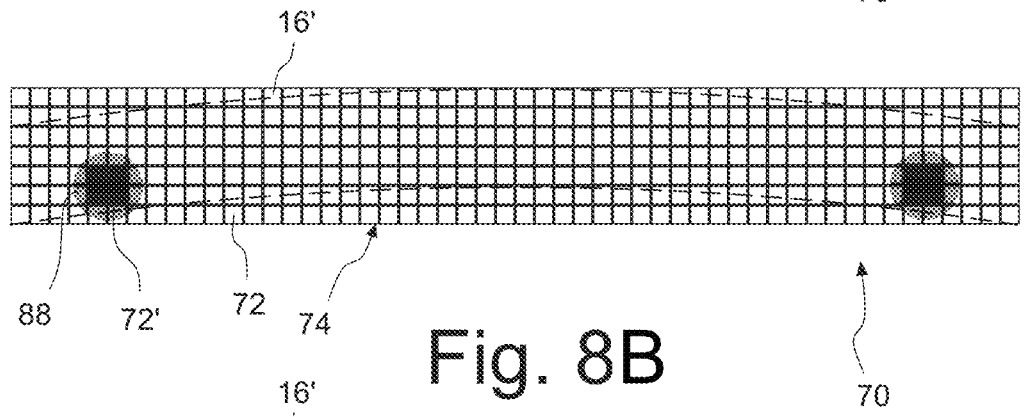

FIG. 8B shows the modulator surface 74 at a later time, at which two overlay markers 84 have entered the illumination field 16. Since these overlay markers 84 should additionally be illuminated by the second projection light 302 with a conventional illumination setting, two or more micromirrors 42' of the micromirror array 42 now direct second projection light 302 onto the modulator surface 72 of the spatial light modulator 70. In FIG. 8B, these light spots are illustrated gray and are denoted by 88. It is possible to see that the light spots 88 have an approximately circular form, to which diffraction effects can also contribute. Thus, this form does not correspond to the form of the overlay markers 84. If these light spots 88 were to directly illuminate the mask 14 via the lens elements 76, 65b, the images of the light spots 88 would extend beyond the overlay markers 84 and also illuminate mask structures 181, which is undesirable.

As a result of the high spatial resolution of the spatial light modulator 70, it is possible to produce any light pattern on the modulator surface 72 within certain boundaries, the light patterns being optimally adapted to the dimensions of the overlay markers 84. It is suggested in the illustrated exemplary embodiment that the overlay markers 84 are square and so large that they correspond to the image of four micromirrors 72' adjoining one another. These four micromirrors 72' within one of the two light spots 88 are actuated by the control device 45 in such a way that they are in the "on" position and direct the second projection light 302 onto the mask 14. All other micromirrors 72 continue to remain in the "off" position.

Figure 8C:
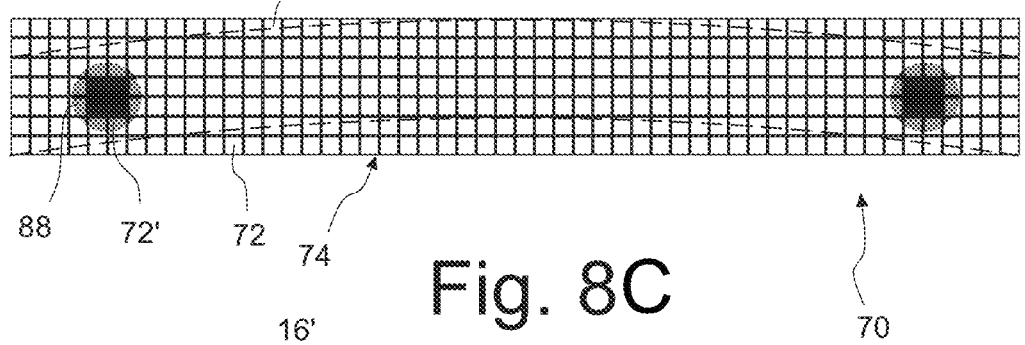
Figure 8D:
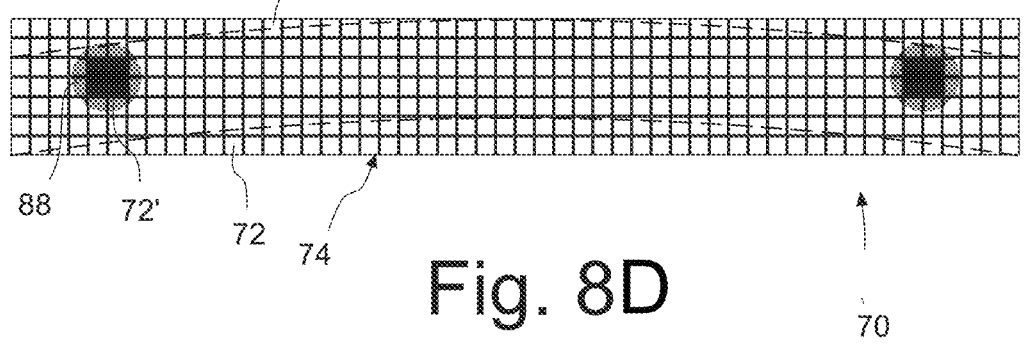

FIGS. 8C and 8D illustrate how the positions of the light spots 88 on the one hand and the groups of micromirrors 72', which are in the "on" position, are carried along the scanning direction Y within the scope of the scanning process.

For reasons of clarity, the spatial light modulator 70 only has relatively few micromirrors 72 in the illustrated exemplary embodiment. Commercially available spatial light modulators 70 frequently have several million micromirrors 72. The spatial resolution, with which practically arbitrary intensity patterns of the second projection light 302 can be produced on the modulator surface 74 and imaged onto the mask 14, is correspondingly high.

4. Alternative Exemplary Embodiment

Figure 9:
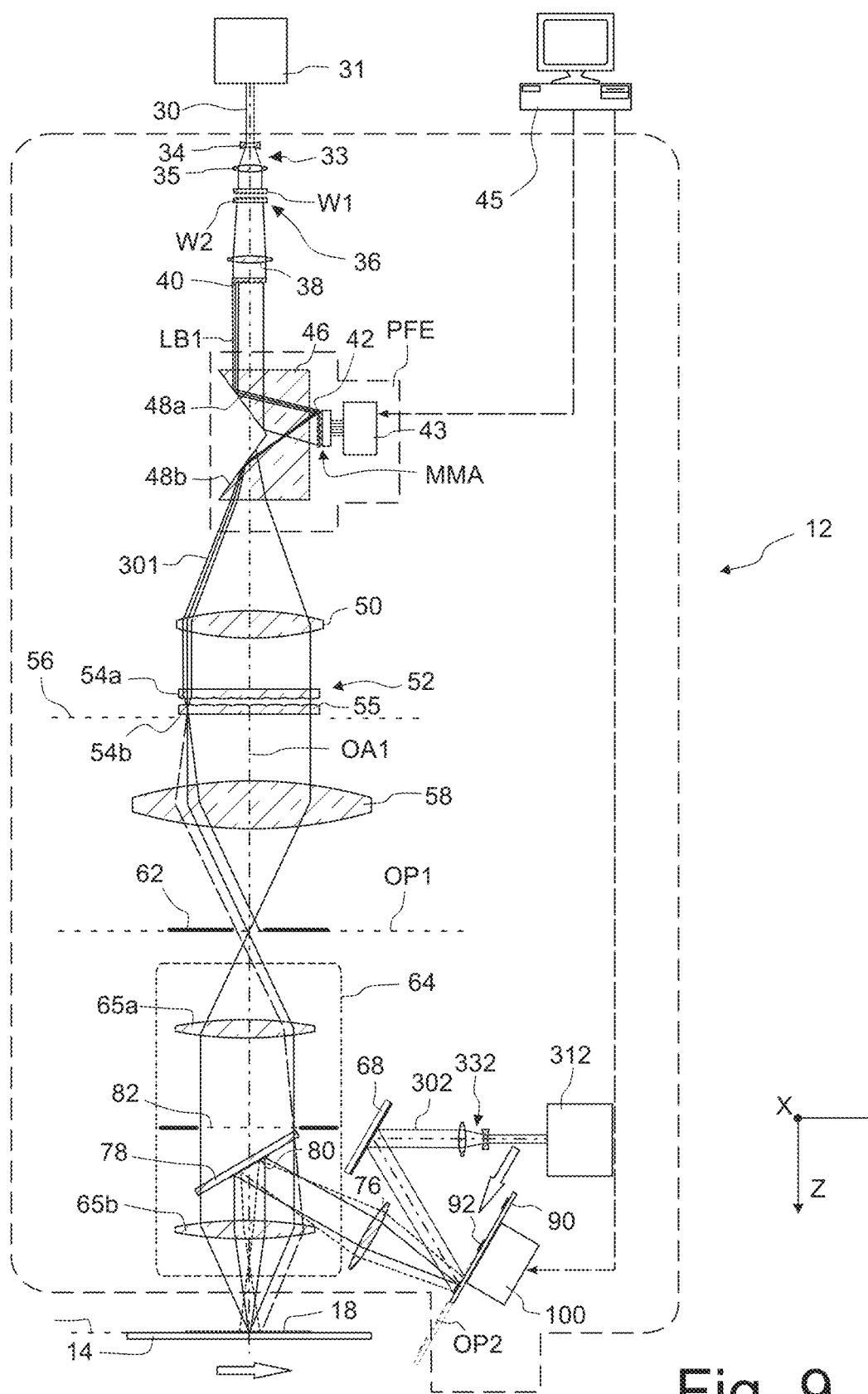
FIG. 9 shows an illustration, based on FIG. 2, of an illumination system according to an alternative exemplary embodiment, in which a carrier with reflective structures applied thereon is imaged onto the mask and displaced synchronously with the latter.

FIG. 9 shows an illumination system 12 according to another exemplary embodiment in a schematic illustration based on FIG. 2. A plate-shaped carrier 90, which carries a pattern of reflective structures 92, is situated in the second object plane OP2, which is imaged onto the mask plane 66 by the lens elements 76 and 65b. The pattern corresponds to the arrangement of the overlay markers 84 on the mask 14, taking account of the imaging scale of the lens formed by the lens elements 76, 65b. During the scanning process, the carrier 90 is displaced along the direction illustrated by an arrow by way of a displacement device indicated at 100. The effect of a running intensity pattern, i.e., an intensity pattern that changes synchronously with the movement of the mask, is likewise obtained in this manner.

In this exemplary embodiment, the second projection light 302 is produced by a dedicated light source 312 and directed onto the reflective structures 92 via a beam expander 332 and a deflection mirror 68. In this exemplary embodiment, too, the angle distribution of the second projection light 302 can be produced by scattering properties of the reflective structures 92 or by an angle-producing element that has been introduced into the light path of the second projection light 302. In particular, a diffusing plate, an optical integrator or a computer-generated hologram (CHG) can be considered for an angle-producing element.

5. Important Method Steps

Figure 10:
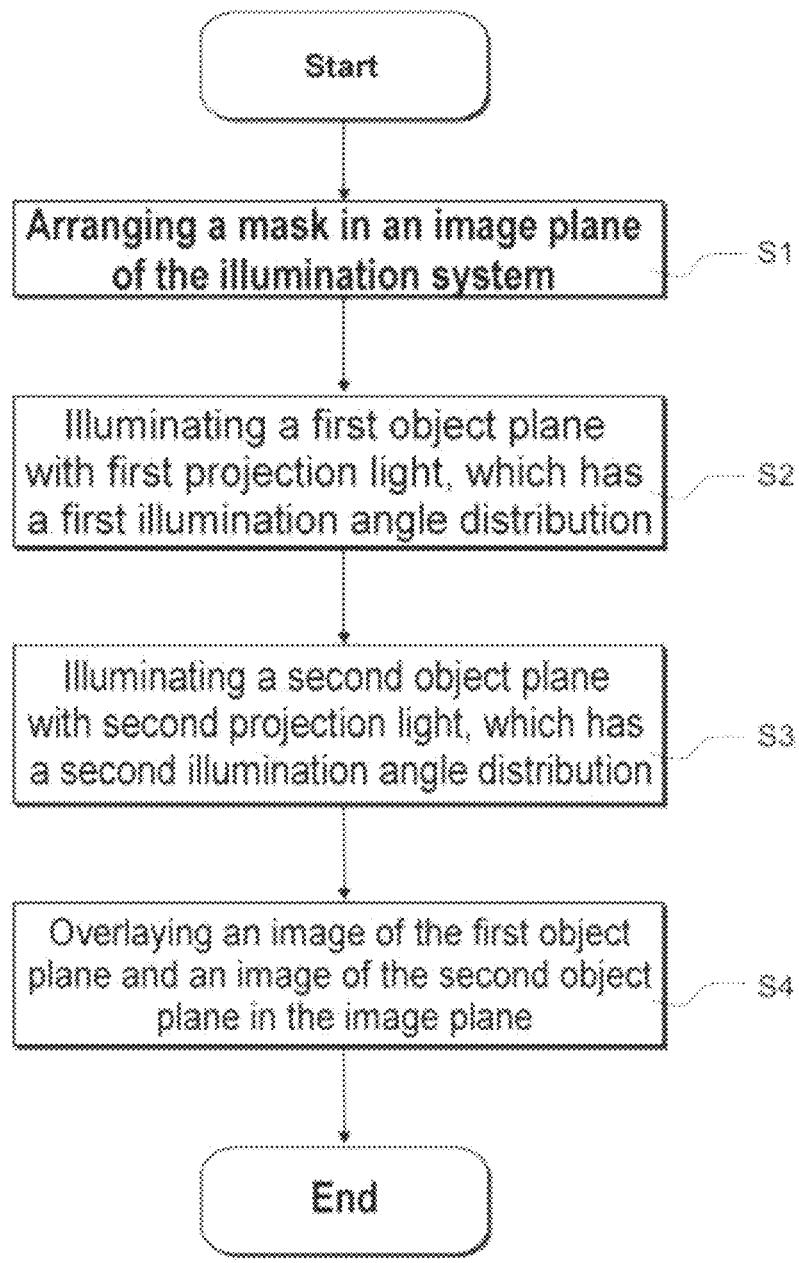
FIG. 10 shows a flowchart illustrating important steps of the method according to the disclosure.

Important steps of the method according to the disclosure are illustrated in the flowchart of FIG. 10.

In a first step S1, a mask is arranged in an image plane of the illumination system.

In a second step S2, a first object plane is illuminated by first projection light that has a first illumination angle distribution.

In a third step S3, a second object plane is illuminated by second projection light that has a second illumination angle distribution.

In a fourth step S4, images of the first object plane and the second object plane are overlaid in the image plane.

6. Important Aspects of the Disclosure

Important aspects of the present disclosure are summarized below in propositions:

1. An illumination system of a microlithographic projection apparatus (10), including:
   a) an image plane (66), in which a mask (14) is arrangeable,
   b) a first object plane (OP1), which is optically conjugated to the image plane (66),
   c) a first illumination optical unit (42, 50, 52, 58), which is configured to illuminate the first object plane with first projection light (301) in such a way that the first projection light has a first illumination angle distribution in the image plane, wherein the first illumination optical unit has an optical integrator (52), which is arranged in the light path of the first projection light (301) only,
   d) a second object plane (OP2), which likewise is optically conjugated to the image plane (66),
   e) a second illumination optical unit (42', 51, 70, 72), which is configured to illuminate the second object plane with projection light (302) in such a way that the second projection light has a second illumination angle distribution in the image plane, the second illumination angle distribution differing from the first illumination angle distribution.

2. The illumination system according to proposition 1, wherein an intensity distribution of the first projection light (301) on the optical integrator (52) sets the first illumination angle distribution.

3. The illumination system according to either of propositions 1 and 2, wherein the optical integrator (52) has an optical raster element (54a, 54b).

4. The illumination system according to any one of propositions 1 to 3, wherein the optical integrator (52) is arranged in a light path of the first projection light (301) between a pupil forming device (PFE) and the first object plane (OP1).

5. The illumination system according to any one of the preceding propositions, wherein illumination angles of the first illumination angle distribution do not occur in the second illumination angle distribution and wherein illumination angles of the second illumination angle distribution do not occur in the first illumination angle distribution.

6. The illumination system according to proposition 5, wherein all illumination angles of the first illumination angle distribution are greater than a limit angle in terms of absolute value and wherein all illumination angles of the second illumination angle distribution are smaller than the limit angle in terms of absolute value.

7. The illumination system according to any one of the preceding propositions, wherein an illumination field (16) is illuminable in the image plane (66) by the first projection light (301) and wherein only one or more portions of the illumination field, but not the entire illumination field, are illuminated at a given time by the second projection light (302).

8. The illumination system according to proposition 7, wherein the second illumination optical unit (42', 51, 70, 72) is actuatable in such a way that the portion covers an overlay marker (84) that is situated on the mask (14).

9. The illumination system according to any one of the preceding propositions, wherein the second illumination optical unit (42', 51, 70, 72) is configured to produce an intensity distribution on the second object plane (OP2), which moves synchronously with the mask (14) along a displacement direction parallel to the second object plane.

10. The illumination system according to any one of the preceding propositions, wherein the first illumination optical unit (42, 50 52, 58) is configured to produce a stationary intensity distribution on the first object plane (OP1).

11. The illumination system according to proposition 9, wherein a modulator surface (74) of a spatial light modulator (70) is arranged in the second object plane (OP2), a modulation pattern that changes synchronously with the movement of the mask (14) being producible on the modulator surface.

12. The illumination system according to proposition 11, including a further spatial light modulator (MMA), which is configured to produce an intensity distribution on the modulator surface (74), the intensity distribution changing synchronously with the movement of the mask (14) along the displacement direction.

13. The illumination system according to proposition 12, wherein the further spatial light modulator (MMA) divides projection light (30) into the first and the second projection light (301, 302).

14. The illumination system according to proposition 12 or 13, wherein the further spatial light modulator (MMA) directs the first projection light (301) onto the optical integrator (52).

15. The illumination system according to proposition 9, wherein a surface of a carrier (90), which carries a pattern of reflective or scattering structures (82) and which is displaceable along the displacement direction, is arranged in the second object plane (OP2).

16. The illumination system according to any one of the preceding propositions, wherein the first projection light (301) and the second projection light (302) are merged by an input coupling element (80) that is arranged between the first and second object plane (OP1, OP2) on the one hand and the image plane (66) on the other hand.

17. The illumination system according to proposition 16, wherein the input coupling element (80) is arranged in, or in the vicinity of, a pupil plane (82) of the illumination system in such a way that the first projection light (301) passes through the pupil plane outside of the input coupling element.

18. The illumination system according to proposition 16 or 17, wherein the input coupling element has a mirror (80) or a prism.

19. The illumination system according to any one of propositions 16 to 18, wherein the input coupling element (80) is arranged in the light path of the first projection light (301) between an adjustable field stop (62) and the image plane (66).

20. The illumination system according to proposition 19, having a lens (64), which has a plurality of optical elements (65a, 65b) and which images the field stop (62) onto the image plane (66), wherein at least one optical element (65a) lies in the light path of the first projection light (301) only.

21. A method for operating an illumination system (12) of a microlithographic projection apparatus (10), including the following steps:
a) arranging a mask (14) in an image plane (66) of the illumination system;
b) illuminating a first object plane (OP1), which is optically conjugated to the image plane, with first projection light (301) in such a way that the first projection light has a first illumination angle distribution in the image plane;
c) illuminating a second object plane (OP2), which differs from the first object plane and which is likewise optically conjugated to the image plane (66), with second projection light (302) in such a way that the second projection light has a second illumination angle distribution in the image plane, the second illumination angle distribution differing from the first illumination angle distribution;
d) overlaying an image of the first object plane and an image of the second object plane in the image plane,
wherein the first projection light in step b) is incident on an optical integrator (52) that is arranged in the light path of the first projection light (301) only.

22. The method according to proposition 21, wherein the first projection light (301) illuminates an illumination field (16) in the image plane (66) and wherein the second projection light (302) only illuminates one or more portions of the illumination field (16), but not the entire illumination field, at a given time.

23. The method according to proposition 22, wherein the portion covers an overlay marker (84) that is situated on the mask (14).

24. The method according to any one of propositions 21 to 23, wherein the mask (14) is displaced along a scanning direction (Y) and wherein an intensity distribution, which is produced in the second object plane (OP2) by the second projection light (302), is displaced along a displacement direction parallel to the second object plane synchronously with the movement of the mask (14).

25. The method according to any one of propositions 21 to 24, wherein an intensity distribution produced by the first projection light (301) in the first object plane (OP1) remains stationary.

26. The method according to any one of propositions 21 to 25, wherein a modulator surface (74) of a spatial light modulator (70) is arranged in the second object plane (OP2) and wherein a modulation pattern that changes synchronously with the movement of the mask (14) is produced on the modulator surface (74).

27. The method according to proposition 26, wherein a further spatial light modulator (MMA) produces the second intensity distribution on the modulation surface (74) in such a way that the intensity distribution changes synchronously with the movement of the mask (14) along the displacement direction.

28. The method according to proposition 27, wherein the further spatial light modulator (MMA) divides projection light (30) into the first and the second projection light (301, 302).

29. The method according to proposition 27 or 28, wherein the further spatial light modulator (70A) directs the first projection light (301) onto the optical integrator (52).

30. The method according to proposition 24, wherein a surface of a carrier (90), which carries a pattern of reflective or scattering structures (92) and which is displaced along the displacement direction, is arranged in the second object plane (OP2).

31. The method according to any one of propositions 21 to 30, wherein the first projection light (301) and the second projection light (302) are merged by an input coupling element (80) that is arranged between the first and the second object plane on the one hand and the image plane (66) on the other hand.

32. The method according to proposition 31, wherein the input coupling element (80) is arranged in, or in the vicinity of, a pupil plane (82) of the illumination system and wherein the first projection light (301) passes through the pupil plane outside of the input coupling element (80).

33. The method according to proposition 31 or 32, wherein the input coupling element has a mirror (80) or a prism.

34. The method according to any one of propositions 21 to 33, wherein the first projection light (301) and the second projection light (302) are merged between an adjustable field stop (62) and the image plane (66).

35. The method according to proposition 34, wherein a lens (64) with a plurality of optical elements (65a, 65b) images the field stop (62) onto the image plane (66) and wherein at least one optical element (65a) lies in the light path of the first projection light (301) only.

36. A method for operating an illumination system of a microlithographic projection apparatus (10), including the following steps:
a) arranging a mask (14) in an image plane (66) of the illumination system (12);
b) illuminating a first object plane (OP1) with first projection light (301), which has a first illumination angle distribution;
c) illuminating a second object plane (OP2) with second projection light (302), which has a second illumination angle distribution;
d) overlaying an image of the first object plane and an image of the second object plane in the image plane.

37. The method according to proposition 36, wherein the first projection light in step b) is incident on an optical integrator (52) that is arranged in the light path of the first projection light (301) only.

38. The method according to proposition 36 or 37, having the features of any one of propositions 21 to 35.
What is claimed is:

1. An illumination system having an image plane and first and second object planes, the image plane being configured so that a mask is arrangeable in the image plane, each of the first and second object planes being optically conjugated to the image plane, the illumination system comprising:
   a first illumination optical unit configured to illuminate the first object plane with first projection light so that the first projection light has a first illumination angle distribution in the image plane, the first illumination optical unit comprising an optical integrator arranged in the light path of the first projection light only; and
   a second illumination optical unit configured to illuminate the second object plane with second projection light that travels along a path so that the second projection light has a second illumination angle distribution in the image plane,
   wherein:
      the second illumination angle distribution is from the first illumination angle distribution;
      there is not an optical integrator along the path of the second illumination light; and
      the illumination system is a microlithographic illumination system.

2. The illumination system of claim 1, wherein:
   illumination angles of the first illumination angle distribution do not occur in the second illumination angle distribution; and
   illumination angles of the second illumination angle distribution do not occur in the first illumination angle distribution.

3. The illumination system of claim 2, wherein:
   all illumination angles of the first illumination angle distribution are greater than a limit angle in terms of absolute value; and
   all illumination angles of the second illumination angle distribution are smaller than the limit angle in terms of absolute value.

4. The illumination system of claim 1, wherein the illumination system is configured so that:
   an illumination field is illuminable in the image plane by the first projection light; and
   at a given time, at least one portion of the illumination field, but not the entire illumination field, is illuminated by the second projection light.

5. The illumination system of claim 4, wherein the second illumination optical unit is actuatable so that the at least one portion covers an overlay marker situated on the mask.

6. The illumination system of claim 1, wherein the second illumination optical unit is configured to produce an intensity distribution on the second object plane, and the intensity distribution on the second object plane moves synchronously with the mask along a displacement direction parallel to the second object plane.

7. The illumination system of claim 6, further comprising a carrier comprising a surface that carries a pattern of reflective or scattering structures, wherein the surface of the carrier is displaceable along the displacement direction, and the surface of the carrier is in the second object plane.

8. The illumination system of claim 1, further comprising an input coupling element configured to merge the first projection light and the second projection light, wherein the input coupling element is between the first object plane and the image plane.

9. The illumination system of claim 8, wherein the input coupling element is arranged in, or in the vicinity of, a pupil plane of the illumination system so that the first projection light passes through the pupil plane outside of the input coupling element.

10. The illumination system of claim 1, further comprising an input coupling element configured to merge the first projection light and the second projection light, wherein the input coupling element is between the second object plane and the image plane.

11. The illumination system of claim 10, wherein the input coupling element is arranged in, or in the vicinity of, a pupil plane of the illumination system so that the first projection light passes through the pupil plane outside of the input coupling element.

12. An apparatus, comprising:
   an illumination system according to claim 1; and
   a projection lens,
   wherein the apparatus is a microlithographic projection apparatus.

13. A method of using a microlithographic projection apparatus comprising an illumination system and a projection lens, the method comprising:
   using the illumination system to illuminate a mask in an illumination plane of the illumination system; and
   using the projection lens to image at least a portion of the illuminated mask onto a photoresist,
   wherein the illumination system is an illumination system according to claim 1.

14. An illumination system having an image plane and first and second object planes, the image plane being configured so that a mask is arrangeable in the image plane, each of the first and second object planes being optically conjugated to the image plane, the illumination system comprising:
   a first illumination optical unit configured to illuminate the first object plane with first projection light so that the first projection light has a first illumination angle distribution in the image plane, the first illumination optical unit comprising an optical integrator arranged in the light path of the first projection light only; and
   a second illumination optical unit configured to illuminate the second object plane with second projection light so that the second projection light has a second illumination angle distribution in the image plane,
   wherein:
      the second illumination angle distribution is from the first illumination angle distribution;
      the second illumination optical unit is configured to produce an intensity distribution on the second object plane;
      the intensity distribution on the second object plane moves synchronously with the mask along a displacement direction parallel to the second object plane;
      the illumination system is a microlithographic illumination system;
      the illumination system further comprises a first spatial light modulator comprising a modulator surface in the second object plane; and
      the illumination system is configured so that a modulation pattern that changes synchronously with the movement of the mask is producible on the modulator surface.

15. The illumination system of claim 14, further comprising a second spatial light modulator, wherein the second spatial light modulator is configured to produce an intensity distribution on the modulator surface, and the intensity distribution on the modulator surface changes synchronously with the movement of the mask along the displacement direction.

16. The illumination system of claim 15, wherein the second spatial light modulator divides projection light into the first projection light and the second projection light.

17. The illumination system of claim 16, wherein the second spatial light modulator is configured to direct the first projection light onto the optical integrator.

18. The illumination system of claim 15, wherein the second spatial light modulator is configured to direct the first projection light onto the optical integrator.

19. A method for operating an illumination system of a microlithographic projection apparatus, the method comprising:
   a) illuminating a first object plane, which is optically conjugated to the image plane, with first projection light so that the first projection light has a first illumination angle distribution in the image plane;
   b) illuminating a second object plane, which differs from the first object plane and which is likewise optically conjugated to the image plane, with second projection light so that the second projection light has a second illumination angle distribution in the image plane, the second illumination angle distribution differing from the first illumination angle distribution; and
   c) overlaying an image of the first object plane and an image of the second object plane in the image plane, wherein:
      the first projection light in a) is incident on an optical integrator that is arranged in the light path of the first projection light only;
      a mask is present in the image plane;
      the method further comprises: d) using a projection lens to image at least a portion of the illuminated mask onto a photoresist;
      an inhomogeneous intensity distribution is produced on the second object plane;
      the inhomogeneous intensity distribution in the second object plane depends on a pattern supported by the mask; and
      the inhomogeneous intensity distribution in the second object plane moves synchronously with a mask along the displacement direction parallel to the second object plane.

20. The method of claim 19, wherein a modulation pattern that changes synchronously with the movement of the mask is producible on the modulator surface.

* * * * *

UNITED STATES PATENT AND TRADEMARK OFFICE
CERTIFICATE OF CORRECTION

PATENT NO. : 10,539,883 B2  
APPLICATION NO. : 15/997498  
DATED : January 21, 2020  
INVENTOR(S) : Markus Deguenther et al.

Page 1 of 1

It is certified that error appears in the above-identified patent and that said Letters Patent is hereby corrected as shown below:

On the Title Page

Column 1 ((72) Inventors), Line 2, delete "Bad Herranalb" and insert -- Bad Herrenalb --;

Column 2 (Other Publications), Line 2, delete "PCT/EP206/078695," and insert -- PCT/EP2016/078695, --;

In the Specification

Column 6, Line 33, delete "simple simple." and insert -- simple. --.

Signed and Sealed this  
Seventh Day of April, 2020

Andrei Iancu  
*Director of the United States Patent and Trademark Office*